United States Patent
Bendik, Jr. et al.

(10) Patent No.: US 6,214,721 B1
(45) Date of Patent: Apr. 10, 2001

(54) METHOD AND STRUCTURE FOR SUPPRESSING LIGHT REFLECTIONS DURING PHOTOLITHOGRAPHY EXPOSURE STEPS IN PROCESSING INTEGRATED CIRCUIT STRUCTURES

(75) Inventors: Joseph J. Bendik, Jr., Sunnyvale; Jeffrey R. Perry, Cupertino, both of CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/358,519

(22) Filed: Jul. 22, 1999

Related U.S. Application Data

(60) Provisional application No. 60/136,325, filed on May 27, 1999.

(51) Int. Cl.[7] .............................................. H01L 21/4763
(52) U.S. Cl. ..................... 438/624; 438/629; 438/636; 438/786
(58) Field of Search ..................................... 438/622, 623, 438/624, 627, 628, 629, 636, 786

(56) References Cited

U.S. PATENT DOCUMENTS

| | | | |
|---|---|---|---|
| 5,525,542 | * | 6/1996 | Maniar et al. ........................ 438/636 |
| 5,639,687 | * | 6/1997 | Roman et al. ........................ 438/636 |
| 5,668,052 | * | 9/1997 | Matsumoto et al. .................. 438/624 |
| 6,017,815 | * | 1/2000 | Wu ........................................ 438/634 |
| 6,025,259 | * | 2/2000 | Yu et al. ............................... 438/618 |
| 6,037,276 | * | 3/2000 | Lin et al. .............................. 438/786 |
| 6,060,380 | * | 5/2000 | Subramanian et al. ............... 438/618 |

* cited by examiner

Primary Examiner—T. N. Quach
(74) Attorney, Agent, or Firm—Stallman & Pollock, llp

(57) ABSTRACT

The present invention provides a "built-in" wave dampening, antireflective thin-film layer in a copper dual damascene film stack that reduces the standing wave intensity in the deep-UV photoresist. This is accomplished by depositing optically customized silicon/oxide/nitride films during dual damascene processing. In particular, one or more silicon nitride layers are replaced with a light absorbing silicon oxynitride film to provide built-in dampening layers. The silicon oxynitride stack can be densified by heat treatments to minimize electrical leakage concerns, if any. The invention eliminates the need for adding extra thin-film stacks during deep-UV photoprocessing.

13 Claims, 3 Drawing Sheets

METHOD AND STRUCTURE FOR SUPPRESSING LIGHT REFLECTIONS DURING PHOTOLITHOGRAPHY EXPOSURE STEPS IN PROCESSING INTEGRATED CIRCUIT STRUCTURES

BENEFIT OF PROVISIONAL APPLICATION

This nonprovisional application claims the benefit of provisional Application Ser. No. 60/136,325, filed May 27, 1999, by Joseph J. Bendik, Jr. and Jeffrey R. Perry, titled "Method and Structure for Suppressing Light Reflections During Photolithography Exposure Steps in Processing Integrated Circuit Structures".

BACKGROUND OF THE INVENTION

1. Field of the Invention

The present invention relates to the manufacture of integrated circuit structures. In particular, the invention relates to suppressing light reflections from an integrated circuit structure during photolithography exposure steps by including wave dampening material in the structure. The techniques of the invention are applicable to both single and dual damascene processes.

2. Discussion of the Related Art

In semiconductor integrated circuit processing, it is common to use a layer of material to suppress reflections from underlying surfaces during photolithography exposure steps. This layer is known an the antireflective coating or ARC. It is desirable to suppress reflections from underlying layers so that the photoresist is not exposed to the reflected light waves which leads to variation in critical dimensions.

The ARC thickness is selected such that the light waves that are reflected off the underlying surface are 180 degrees out of phase with the light waves that are reflected off the top surface of the ARC. In this way, destructive interference occurs and the reflection is suppressed. This is shown in FIG. 1.

The total distance that a light wave travels is determined by the thickness of the material that it passes through. Unfortunately, due to process variations and the effects of processing, the thickness of the materials may vary substantially over time. If the thickness of the materials through which the reflected light must pass does vary, then the light waves that are reflected from the bottom material will not be exactly 180 degrees out of phase with the light waves that are reflected off the ARC. In this case, only partial destructive interference occurs and some of the reflected light waves escape and double expose the photoresist.

This problem of varying thickness becomes worse when materials which are transparent to the wavelength of light used during photolithographic exposure are used in the process architecture. An example of this is during processing of a copper dual damascene film stack. This is shown in FIG. 2. In this case, some of the materials under the ARC may be silicon dioxide, silicon nitride or low k dielectrics that are largely transparent to the incoming light. Other materials under the ARC, such as copper metal, reflect the incoming light in varying amounts. The reflection from underlying materials may occur off different metal layers or off the silicon substrate. Thus, the light waves must travel a considerable distance through materials which may vary in thickness from the desired amount by hundreds or thousands of Angstroms due to normal process variations. Thickness variations of this amount render the top ARC layer ineffective for destructive interference.

SUMMARY OF THE INVENTION

An embodiment of the present invention provides one or more "built-in" wave dampening, antireflective thin-film layers in a copper dual damascene film stack. The wave dampening layers reduce the standing wave intensity in the deep-UV photoresist. This is accomplished by depositing optically customized silicon/oxide/nitride films during dual damascene processing. In particular, one or more of the silicon nitride layers utilized in conventional dual damascene processing are replaced with a light absorbing silicon oxynitride film to provide built-in dampening layers. The silicon oxynitride stack can be densified by heat treatments to minimize electrical leakage concerns, if any. The invention eliminates the need for adding extra thin-film stacks during deep-UV photoprocessing.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

The use of wave dampening antireflective material below an antireflective coating layer in accordance with the concepts of the present invention will now be described in the context of copper/$SiO_2$ dual damascene processing. Those skilled in the art will appreciate that the dual damascene processing steps described below can be utilized in the formation of any and all metal interconnect layers in an integrated circuit structure using any and all insulating layers between the metal layers (including low k dielectrics), and including but not limited to formation of an interconnect layer for contact to the silicon substrate. Those skilled in the art should also appreciate that description of the invention in the context of dual damascene processing is exemplary, not limiting. The inventive concept of using wave dampening material within the structure is applicable to a wide variety of integrated circuit fabrication modules, including single damascene.

Figure 3:
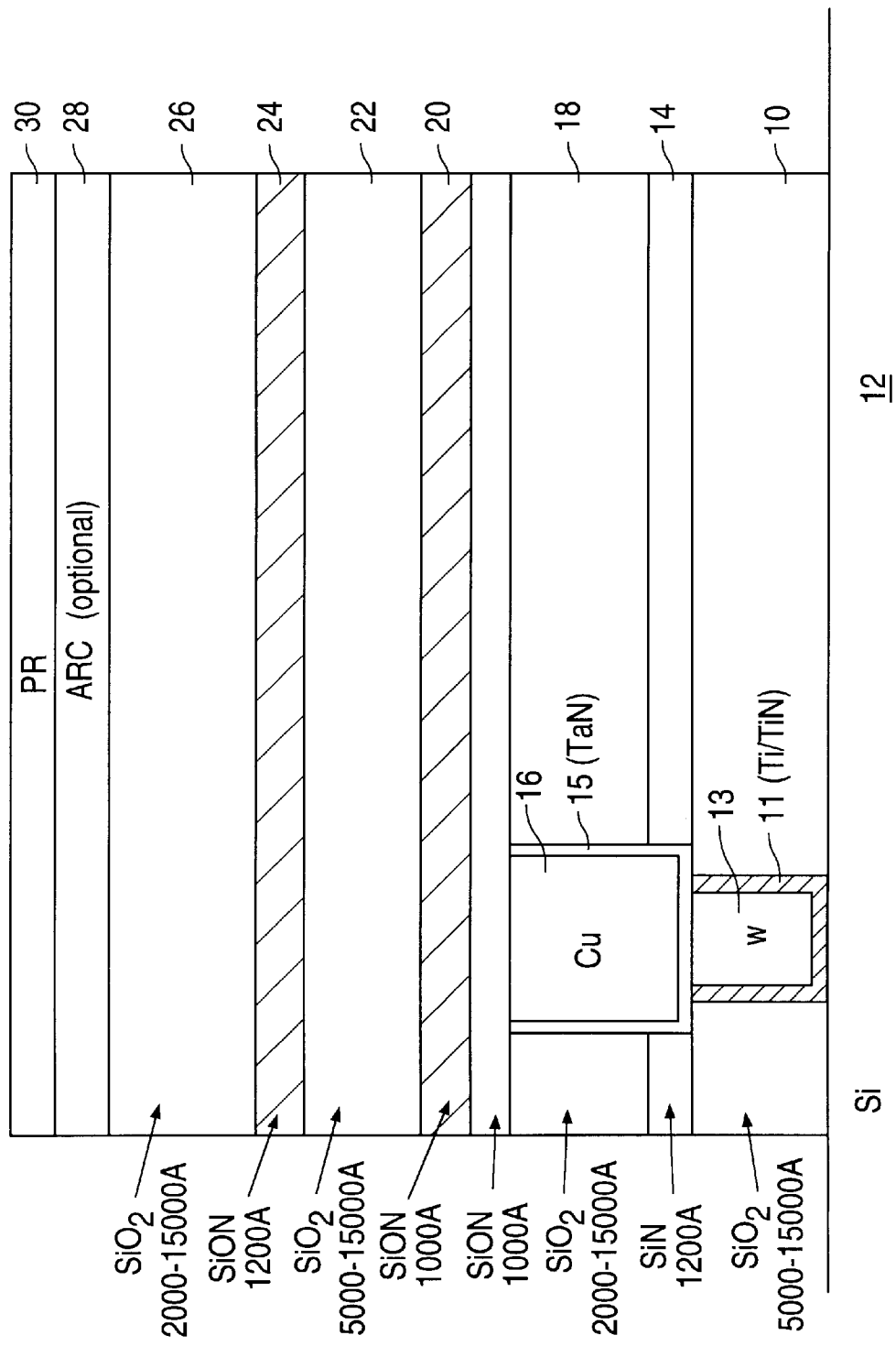
FIG. 3 is a cross-section view illustrating utilization of a "builtin" wave dampening antireflective layer beneath an antireflective coating in dual damascene processing in accordance with the present invention.

Referring now to FIG. 3, in the disclosed embodiment of a dual damascene process in accordance with the present invention, a first dielectric layer 10, for example $SiO_2$, about 5000–15,000 Angstroms thick is formed on an underlying silicon substrate 12 that contains electrical circuit structures. Next, contact holes lined with Ti/TiN 11 and tungsten plugs 13 are formed in the conventional manner. A first SiN or SiON layer 14 about 1200 Angstroms thick is then formed on the first $SiO_2$ layer 10. A second layer 18 of $SiO_2$ about 2000–15000 Angstroms thick is then deposited, patterned and etched down through the SiN (or SiON) layer 14 to define damascene trenches. Layers of TaN liner 15 and copper are then deposited and polished using CMP to define a patterned copper interconnect structure 16 on the first SiO$_2$ layer 10. A layer 17 of about 1000 Angstroms of SiN is then deposited on the SiO$_2$/Copper. In accordance with the present invention, a first "customized" silicon oxynitride (SiON) wave dampening layer 20 about 1000 Angstroms thick is then deposited on the planarized second SiO$_2$ layer 18 and on the exposed top surface at the patterned copper layer 16. A third SiO$_2$ layer 22 approximately 5000–15,000 Angstroms thick is then deposited on the first customized SiON layer 20. A second "customized" SiON wave dampening layer 24 approximately 1200 Angstroms thick is then deposited on the third SiO$_2$ layer 22. A fourth SiO$_2$ layer 26 approximately 2000–15,000 Angstroms thick is then deposited on the second customized SiON layer 24.

Figure 1:
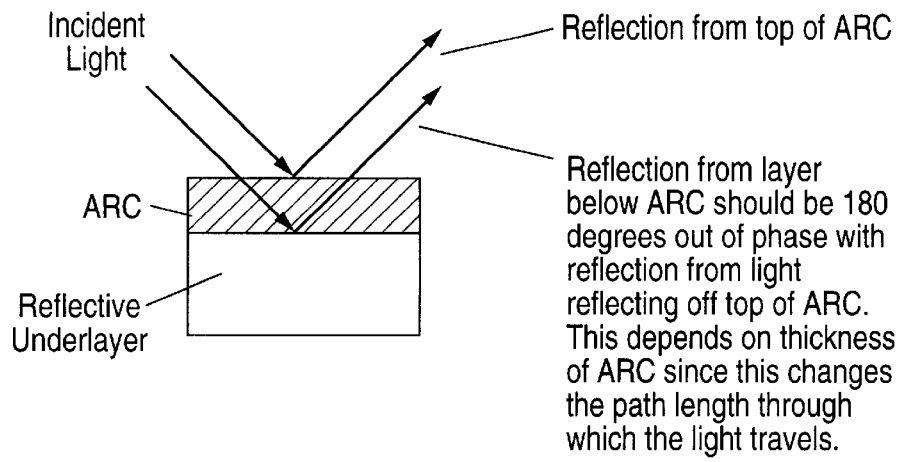
FIG. 1 is a cross-section view illustrating light reflection from a layer below an antireflective coating.
Figure 4:
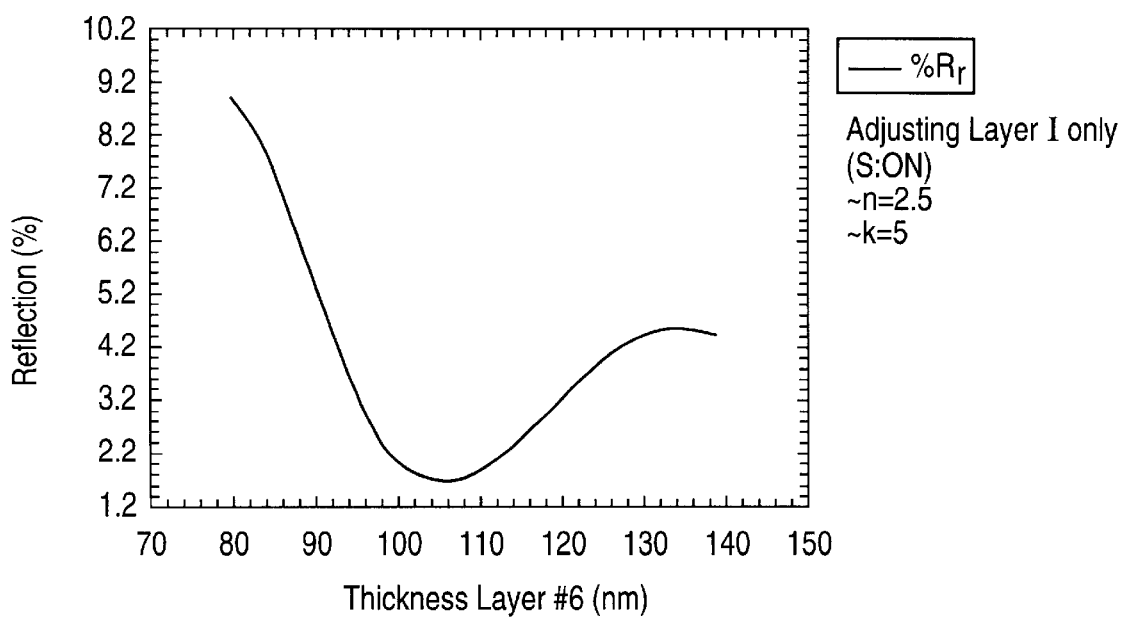
FIG. 4 is a graph showing % reflection of an SiON layer as a function of thickness.
Figure 2:
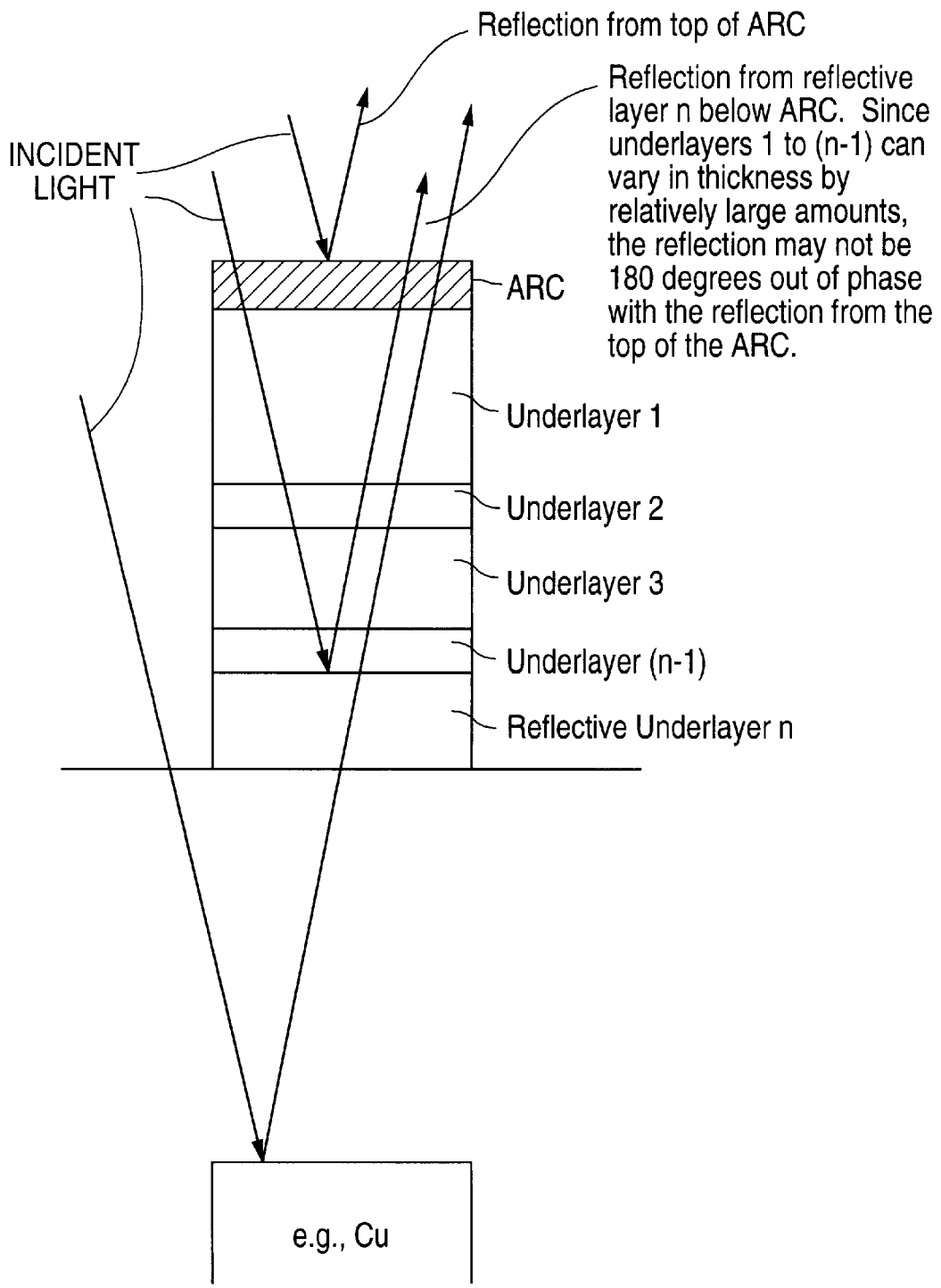
FIG. 2 is a cross-section view illustrating light reflection from a layer n below an antireflective coating.

Those skilled in the art will appreciate that the thickness of the first SiON layer 20 and of the second SiON layer 24 will be "customized" to provide a desired minimum amount of reflection. The FIG. 4 graph shows an example of SiON having n=2.5 and k=5 wherein a minimum reflection of about 2% occurs at a film thickness of about 100–110 nm.

Those skilled in the art will further appreciate that the abovedescribed structure is now suitable for dual damascene patterning and etching to provide contact to the patterned copper interconnect structure 16. In the illustrated embodiment, an antireflective coating (ARC) layer 28 is formed on the fourth SiO$_2$ layer 26. A deep-UV photoresist layer 30 is then formed on the ARC layer 28. In accordance with conventional photolithographic processing techniques, selected regions of the photoresist layer 30 are then exposed to light to develop a pattern on the photoresist for the purpose of implementing the dual damascene etch steps. (As indicated in FIG. 3, the ARC layer 28 is optional depending upon the effectiveness of the one or more dampening layers (20/24) in providing sufficient reduction in reflectivity. If the ARC layer 28 is not used, then the resist 30 is formed directly on the SiO$_2$ layer 28).

Those skilled in the art will appreciate that, following the dual damascene etch steps, the patterned photoresist mask is stripped and copper contacts are formed to the underlying copper interconnect layer 16. Following the formation of these contacts, and the patterning of the contact metal layer, a chemical mechanical polishing (CMP) step can be performed to planarize the upper surface of the structure.

Those skilled in the art will further appreciate that these steps (after first copper is polished) can be repeated to add more metal layers to the structure.

It should be understood that various alternatives to the embodiment of the invention described herein may be employed in practicing the invention. It is intended that the following claims define the scope of the invention and that methods and structures within the scope of these claims and their equivalents be covered thereby.

What is claimed is:

1. A method of reducing light reflectance in a damascene integrated circuit structure, the method comprising:

forming a first dielectric layer on an underlying semiconductor substrate that contains integrated circuit elements;

forming a contact opening in the first dielectric layer to expose a surface of one of the integrated circuit elements;

forming a conductive contact in the contact opening to contact the exposed surface of the integrated circuit elements;

forming a layer of light wave dampening material on the first dielectric layer;

forming a second dielectric layer on the layer of light wave dampening material;

forming a layer of photoresist on the second dielectric layer;

exposing selected regions of the photoresist layer to light such that the light penetrates the second dielectric layer and is at least partially absorbed by the layer of light wave dampening material;

removing the exposed selected regions of the photoresist layer to provide a patterned photoresist mask;

using the patterned photoresist mask to etch a via opening in the second dielectric layer and in the layer of light wave dampening material to expose a top surface of the conductive contact; and forming a conductive via plug in the via opening in contact with the conductive contact.

2. A method as in claim 1, and wherein the first dielectric layer comprises silicon oxide.

3. A method as in claim 2, and wherein the conductive contact comprises:

a layer of contact opening liner material formed on sidewalls of the contact opening and on the exposed surface of the integrated circuit element; and a conductive contact plug formed on the layer of contact opening liner material.

4. A method as in claim 3, and wherein the conductive via plug comprises:

a layer of via opening liner material formed on sidewalls of the via opening and on the exposed surface of the conductive contact; and a conductive via plug formed on the layer of via opening liner material.

5. A method as in claim 4, and wherein the via opening liner material comprises TaN and the conductive via plug comprises copper (Cu).

6. A method as in claim 4, and wherein the light wave dampening material comprises silicon oxynitride (SiON).

7. A method as in claim 6, and wherein the second dielectric layer comprises silicon oxide.

8. A method as in claim 2, and wherein the contact opening liner material comprises Ti/TiN and the conductive contact plug comprises tungsten (W).

9. A method as in claim 1, and further comprises:

prior to the step of forming a photoresist layer, forming an antireflective coating (ARC) layer on the second dielectric layer.

10. A method of reducing light reflectance in a dual damascene integrated circuit structure formed on a silicon substrate containing integrated circuit elements, the method comprising:

forming a first SiO$_2$ layer on the silicon substrate;

forming a contact opening in the first SiO$_2$ layer to expose a surface of an integrated circuit element;

forming a conductive contact opening liner on sidewalls of the contact opening and on the exposed surface of the integrated circuit element;

forming a contact plug on the contact opening liner to fill the contact opening;

forming a first SiN layer on the first SiO$_2$ layer and over the contact plug;

forming a second SiO$_2$ layer on the first SiN layer;

forming a via opening in the second SiO$_2$ layer and in the first SiN layer to expose a surface of the contact plug;

forming a conductive via opening liner on sidewalls of the via opening and on the exposed surface of the contact plug;

forming a conductive via plug on the via opening liner to fill the via opening;

forming at least one layer of light wave dampening material over the second $SiO_2$ layer and the via plug;

forming at least one layer of dielectric material over the layer of light wave dampening material;

forming a layer of photoresist over the at least one layer of dielectric material; and exposing selected regions of the photoresist layer to light such that the light penetrates the at least one layer of dielectric material and is at least partially absorbed by the layer of light wave dampening material.

11. A method as in claim 10, and further comprising:

removing the exposed selected regions of the photoresist layer to provide a patterned photoresist mask;

using the patterned photoresist mask to etch a second via opening in the at least one layer of dielectric material and the at least one layer of light wave dampening material to expose a surface of the via opening plug.

12. A method as in claim 10, and wherein the steps of forming at least one layer of light wave dampening material are forming at least one layer of dielectric material compromise:

forming a second SiN layer on the second $SiO_2$ layer and on the via opening plug;

forming a first layer of silicon oxynitride (SiON) on the second SiN layer;

forming a third $SiO_2$ layer on the first layer of SiON;

forming a second layer of SiON on the third $SiO_2$ layer; and forming a fourth $SiO_2$ layer on the second layer of SiON.

13. A method as in claim 12, and wherein the step of forming a layer of photoresist is preceded by forming an antireflective coating on the fourth $SiO_2$ layer.

* * * * *